March 24, 1970 B. D. HUNTS 3,502,951

MONOLITHIC COMPLEMENTARY SEMICONDUCTOR DEVICE

Filed Jan. 2, 1968 3 Sheets-Sheet 1

INVENTOR.

Barney D. Hunts

BY Norman N. Kunitz

ATTORNEY

MONOLITHIC COMPLEMENTARY SEMICONDUCTOR DEVICE

United States Patent Office 3,502,951

Patented Mar. 24, 1970

3,502,951

MONOLITHIC COMPLEMENTARY SEMICONDUCTOR DEVICE

Barney D. Hunts, Los Altos Hills, Calif., assignor to The Singer Company, a corporation of New Jersey Filed Jan. 2, 1968, Ser. No. 695,217
Int. Cl. H01l *19/00*
U.S. Cl. 317—235 3 Claims

ABSTRACT OF THE DISCLOSURE

A unitary semiconductor structure containing a pair of electrically isolated complementary vertical semiconductor devices, in particular an NPN and a PNP transistor, and the method of forming same whereby the complementary devices are simultaneously formed under conditions allowing the substantial optimization of both devices. The structure and method of the invention also allows one of the devices to take the form of a four-layer controlled rectifier without requiring any additional processing steps.

FIELD OF INVENTION

This invention relates to semiconductor components and, in particular, unitary semiconductor structures, and methods of forming or making same, which contain electrically isolated complementary semiconductor devices, for example, an NPN and a PNP transistor.

BACKGROUND, PRIOR ART

In the integrated circuit art, structures which perform the functions of conventional electronic circuit elements, for example, resistors, capacitors, diodes, transistors, etc., are formed or provided within a unitary body of semiconductor material, electrically isolated as needed, and selectively interconnected by means of conductive leads to provide a functional circuit. Although various methods and techniques for forming integrated circuits are well known in the art, difficulties have long been experienced where it is desired to form an integrated circuit having complementary devices, i.e., both an NPN and a PNP transistor. These difficulties are generally due to the large number of finely controlled diffusion operations required, the improper performance of any one of which generally results in an unsatisfactory composite structure. Moreover, since it is desirable that the various regions of the devices be simultaneously formed insofar as is practical, and since the diffusion cycles for each of the devices is different, the resulting diffusion cycle used to form the composite structure is generally a compromise between the optimum diffusion cycles for either of the devices. Thus, although the resulting integrated circuit contains the desired complementary or opposite polarity transistors, the operating characteristics of neither of the transistors will be optimum.

One method, according to the prior art of overcoming this latter problem, is to fabricate the integrated circuit in such a way that one of the transistors is a conventional, vertical, or planar type transistor, whereas the complementary transistor is formed as a lateral structure. Such a composite structure has the advantage of requiring only the optimum processing steps required to fabricate the vertical transistor of the pair. However, the resulting structural arrangement has the disadvantage that the lateral transistor will have a much lower gain and band width than the vertical transistor. Even for those applications wherein frequency response is of secondary importance, it is necessary to provide the integrated circuit with a third transistor of the same general structure and polarity as the vertical transistor for use in conjunction with the lateral transistor as a phase inverting high gain pair.

SUMMARY OF INVENTION

The above problems in the prior art are overcome according to the invention by providing a unique, unitary semiconductor structure having a pair of electrically isolated vertical complementary transistors but which is fabricated by a process requiring only a single diffusion in addition to the optimum processing steps for a transistor of one polarity. Briefly, the structure according to the invention comprises a unitary body of semiconductor material having first and second electrically isolated regions of a first conductivity type located therein adjacent to a planar surface. Disposed within the first region, and extending from the surface thereof, is a third semiconductor region of the opposite conductivity type which forms a PN junction with the first region. A fourth semiconductor region of the first conductivity type is disposed within the third region to form a PN junction that extends to the surface, thereby forming a first vertical transistor wherein the third region serves as the base region and the first and fourth regions serve as the collector and emitter regions. Disposed within the second semiconductor region are fifth and sixth semiconductor regions of the opposite conductivity type. The sixth semiconductor region extends from the surface and joins the fifth region, which is located wholly within the second region remote from the surface, in a manner to enclose and electrically isolate a portion of the second region. A seventh semiconductor region of the opposite conductivity type is disposed within the enclosed portion of the second region and forms a PN junction therewith which extends to the surface, thereby forming a second vertical transistor but of a polarity opposite to that of the first transistor, wherein the enclosed portion of the second region serves as the base region and the fifth and seventh regions serve as the emitter and collector regions.

The above referred to structure according to the invention has the additional advantage that if instead of a pair of complementary transistors it is desired that the unitary structure contain only one transistor and a four-layer controlled rectifier, commonly referred to as an SCR, the structure may be easily modified to contain this arrangement by merely forming an eighth semiconductor region of the first conductivity type within the seventh region. Moreover, as will be readily apparent from the following discussion of the method according to the invention, this latter structure can be achieved without requiring any additional processing steps.

Briefly, the method according to the invention is initiated by simultaneously diffusing first and second spaced, highly conductive regions of a first conductivity type, for example, N-type, into a substantially planar surface of a semiconductor substrate of the opposite conductivity type, for example, P-type. An impurity having a diffusion rate greater than that of the impurity used to form the first and second regions is then diffused into the surface of the substrate to simultaneously form a highly conductive opposite conductivity type region within the second region, and a highly conductive opposite conductivity type region on said surface of the substrate having a surface pattern which individually encloses each of the first and second regions. A layer of semiconductor material of the first conductivity type is then epitaxially grown on the surface of the substrate. During the epitaxial growth, the impurities contained in the diffused regions partially diffuse into the epitaxial layer. Due to the differences in diffusion rate of the impurities, at the completion of the epitaxial growth, the diffusions of the various impurities result in the formation of an opposite conductivity type layer which is buried within the epitaxial layer and is separated and electrically isolated from the substrate by a highly conductive first conductivity type region resulting from the diffusion of the characteristic impurities contained in the above-mentioned second region. An opposite conductivity type region having a pattern similar to the above-mentioned surface pattern and which is in substantial registry therewith is then formed adjacent the exposed surface of the epitaxial layer by the diffusion of a characteristic impurity, and the diffusion is continued until the regions formed by both of the surface patterns join, thereby effectively providing isolation rings which electrically isolate first and second regions of the epitaxial layer, with the buried layer being located within the second region. Simultaneously with the diffusion step used to complete the isolation rings, an opposite conductivity type region having a closed geometrical surface configuration which surrounds a portion of the surface 21 of the epitaxial layer is also formed by diffusion within the second region of the epitaxial layer so that it extends from the surface 21 to the buried layer and joins therewith, thereby enclosing a portion of the second region of the epitaxial layer Opposite conductivity type surface regions are then simultaneously formed within the first region of the epitaxial layer and within the enclosed portion of the second region of the epitaxial layer. At this point in the fabrication process, a structure operable as a vertical transistor, for example, of a PNP-type, has been fabricated within the second region of the epitaxial layer with the enclosed portion of the second region functioning as the base region of the transistor. In order to complete the fabrication of the conventionally structured double diffused opposite polarity transistor, i.e., NPN transistor, a highly conductive region of the first conductivity type is then formed, by the diffusion of a suitable impurity, within the opposite conductivity type region located within the first region of the epitaxial layer. This last-mentioned diffused region then serves as the emitter region of the latter formed transistor.

The above-described method, in addition to providing a pair of complementary structures while requiring only one additional diffusion operation in addition to the processing steps normally required to form transistors of a single polarity, has the additional advantage that the non-conventionally structured transistor, i.e., the transistor indicated as a PNP transistor in the above description of the method, has a higher gain and band width than that normally obtainable with a lateral-type transistor. This is due to the fact that these characteristics are a function of the base width of the transistor which, since it is determined by the diffusion depth and the epitaxial layer thickness, can be accurately controlled to much smaller dimensions than those obtainable in laterally diffused transistors.

The above-mentioned method according to the invention has the additional advantage that if, instead of a pair of complementary transistors, it is desired that the final structure contain a single transistor and an SCR, then such structure can easily be obtained without requiring any additional processing steps by forming a highly conductive first conductivity type region within the opposite conductivity type region located in the enclosed portion of the epitaxial layer at the same time that the emitter region of the conventionally structured double diffused transistor is formed.

BRIEF DESCRIPTION OF THE DRAWINGS

The invention and the advantages thereof will be more cearly understood from the following detailed description thereof taken in conjunction with the accompanying drawings wherein.

SUMMARY OF INVENTION

Figures 1, 2:
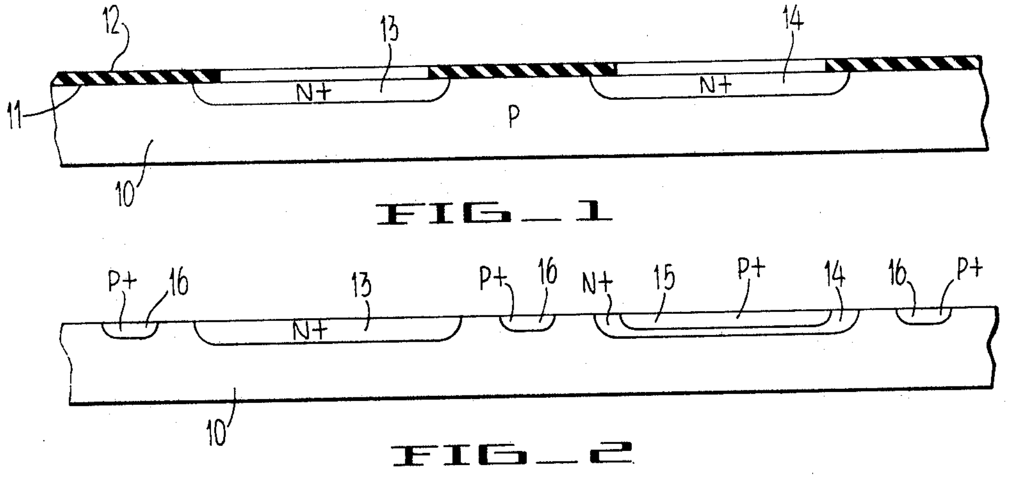
FIGS. 1, 2, 4, 5, and 7 are side view, in cross section.

Referring now to FIG 1, there is shown a wafer or substrate 10 of a suitable monocrystalline semiconductor material, such as silicon or germanium. The wafer 10, which, preferably, and for the remainder of the description of the invention, is silicon, is doped with suitable impurities, for example, by including suitable impurities in the melt from whch the wafer is grown, to render the wafer a particular conductivity type. Preferably, as indicated, the wafer 10 is of P-type conductivity caused by doping with any of the well-known acceptor type dopants, such as boron, indium, aluminum, etc., and has an impurity concentration of about $10^{17}$ dopant atoms per cubic centimeter. Formed on a substantially planar surface 11 of the wafer 10 is a diffusion mask 12, for example, a layer of silicon oxide, having openings at selected locations where it is desired to diffuse various impurities into the exposed portions of the underlying surface 11. The diffusion mask 12 may be formed by any of the well-known techniques known in the art. For example, a silicon wafer 10 may be heated in an oxidizing atmosphere at a relatively high temperature, such as 1,200° centigrade to form an oxide layer on the surface 11, and then the openings made in the layer by means of conventional photoetching techniques. It should be noted at this time that although not shown in any of the succeeding figures, similarly constructed diffusion masks are, in fact, required for all of the diffusion operations.

As shown in FIG. 1, the diffusion mask 12 contains a pair of openings through which a suitable impurity may be introduced to the surface 11 to form a pair of spaced regions 13 and 14 of the conductivity type opposite to that of the wafer 10. As indicated, the regions 12 and 13 are of N-type conductivity, formed, for example, by the diffusion of convention donor-type impurities. Preferably, the donor-type impurities used are those which have a relatively slow diffusion rate in silicon, such as arsenic or antimony. Because of the particular functions which the regions 13 and 14 serve in the finished structure, they are diffused in a manner whereby they are highly conductive (low resistivity) as indicated by an N+. Surface concentrations in the order of $10^{20}$ dopant atoms per cubic centimeter are sufficient for this purpose.

The surface 11 of the wafer 10 is then provided with a second suitable diffusion mask (not shown) and as shown in FIG. 2, a highly conductive region 15 of the same conductivity type as the wafer 10 (P-type in the illustrated example) is formed within the region 14 by the diffusion of a suitable impurity. The impurity used for this diffusion must have a diffusion rate in the semiconductor material which is greater than that used to form the region 14. A suitable impurity for this purpose is gallium or boron.

Figure 3:
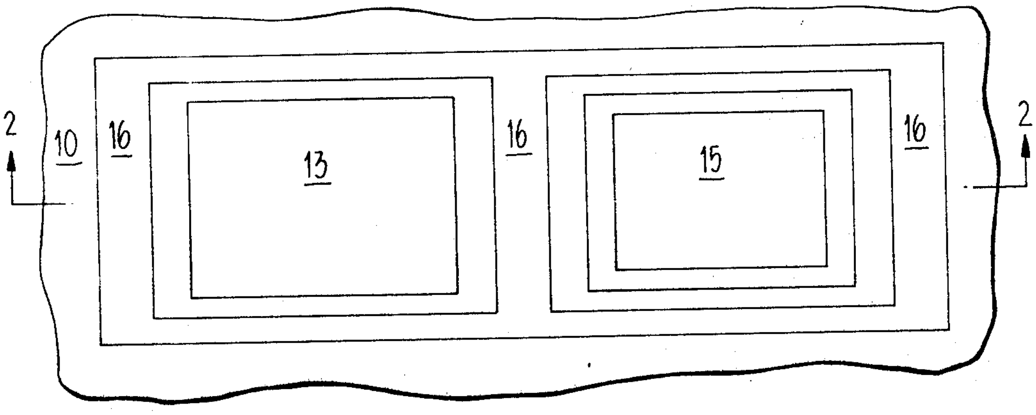
FIGS. 3 and 6 are plan views of FIGS. 2 and 5, respectively, illustrating the semiconductor device according to the invention at various steps in the fabrication process.

Simultaneously with the formation of the region 15, there is also formed a highly conductive region 16. The region 16, as shown in plan view in FIG. 3 has a pattern on the surface 11 which completely and individually encloses but is spaced from each of the regions 13 and 14. The region 16 will, as is well-known in the integrated circuit art, serve as a portion of an isloation ring to electrically isolate various portions of an integrated circuit by means of PN junctions. Surface concentration of about $10^{20}$ dopant atoms per cubic centimeter are sufficient for the formation of the regions 15 and 16.

Figure 4:
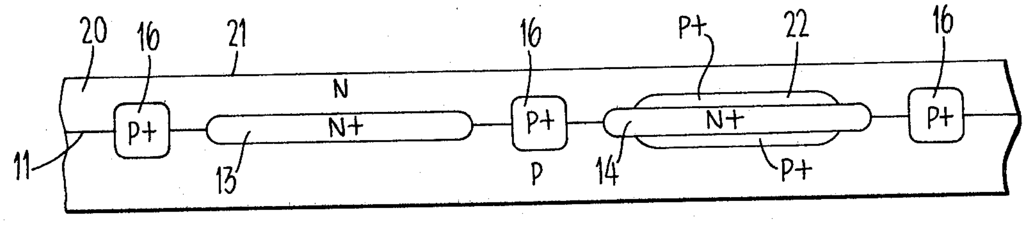

Referring now to FIG. 4, a layer 20 of the conductivity type (N-type in example) opposite that of the wafer 10 is then epitaxially grown or formed on the surface 11; for example, by decomposing a compound of the semiconductor material at an elevated temperature. The resistivity of the layer 20 should have a resistivity suitable for the formation therein of a diffused transistor collector junction. A range of resistivities suitable for this purpose is from about .01 to about 5 ohm-centimeters. The epitaxial layer 20 should be sufficiently thick to allow the formation of a double diffused planar transistor therein; consequently, a thickness of about 7 to 13 microns is sufficient.

It should be noted that during the epitaxial growth of the layer 20, the elevated temperatures required therefor are sufficient to caused the impurities contained in the regions 13 to 15 to further diffuse into the substrate 10. Additionally, as indicated in FIG. 4, the impurities will also diffuse into the epitaxial layer being grown, with the result that after the epitaxial growth, the regions 13, 14, and 16 extend within the resulting structure on either side of the surface 11 in a fairly symmetrical arrangement. With respect to the impurity previously contained in the region 15, however, since this impurity is selected so that it has a higher diffusion rate in the semiconductor material than that of the impurity contained in the region 14, the additional diffusion thereof results in the formation of a layer or region 22 which is buried solely within the epitaxial layer 20 and is electrically isolated from the substrate 10 by means of the PN junction formed between the the regions 14 and 22.

Figures 6, 7:
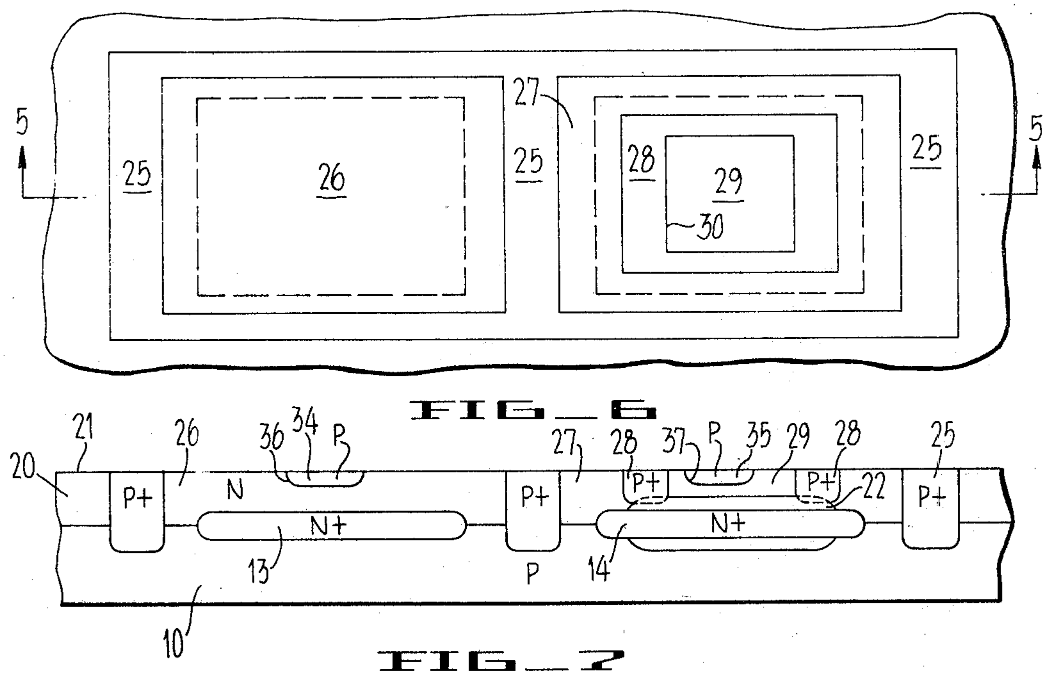

Following the growth of the epitaxial layer 20, a low-resistivity (high conductivity) region 25 of the same conductivity type as the substrate 10 is formed in the epitaxial layer 20 by diffusing a suitable characteristic impurity, for example, boron, into the substantially planar surface 21. As shown in FIG. 6, the region 25 has a surface pattern similar to that of the region 16 and is in substantial registry therewith. The diffusion operation to form the region 25 is continued for a time sufficient to cause the region 25 to diffuse into the layer 20 so that it joins with the region 16 to form a composite region which extends from the surface 21 to the substrate 10. The effect of this composite structure is to enclose and electrically isolate a pair of regions 26 and 27 of the epitaxial layer 20; the electrical isolation being provided by the PN junctions formed between the composite region 16–25 and the regions 26 and 27.

Simultaneously with the formation of the region 25, a further region 28 having a closed geometrical confighration is formed within the region 27 and overlying the region 22. Since the regions 16 and 22 and the regions 25 and 28 have, respectively, been snbjected to identical diffusion cycles, the region 28 will extend sufficiently deep into the epitaxial layer to reach and join with the buried layer 22, resulting in a portion 29 of the region 27 being electrically isolated from the remainder of the region 27 by means of the PN junction 30 formed between the portion 29 and the regions 22 and 28.

Figure 5:
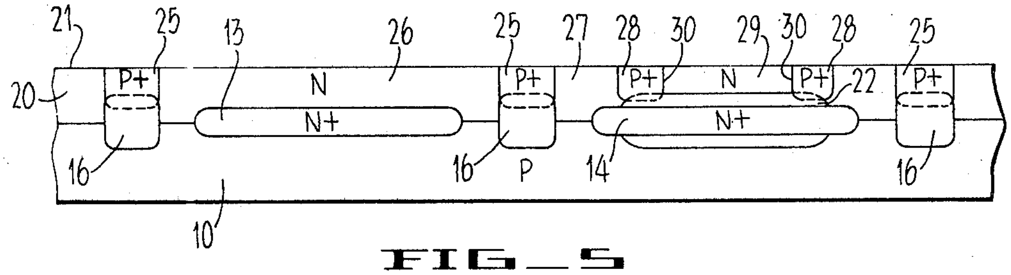

As shown in FIG. 7, the structure of FIG. 5 is then subjected to an additional dicusion operation wherein a desired impurity is diffused into the surface 21 at selected locations to form a pair of regions 34 and 35 within the regions 26 and 29, respectively. The impurity used to form these regions, for example, boron, is selected so that regions 34 and 35 are of a conductivity type (P-type) opposite that of the regions 26 and 29, thereby forming respective PN junctions 36 and 37 which extend to the surface 21. The impurity concentration for the regions 34 and 35 and the diffusion time are those conventionally used for a base diffusion in a conventional double diffused planar transistor.

It should be noted at this time that the structure formed in the region 27 is operable as a PNP transistor with the portion 29 functioning as the base region, the composite region formed by the region 28 and the layer 22 as the emitter region, and the region 35 as the collector region. If desired, however, the functions of the regions 22–28 and 35 may be readily interchanged. Moreover, as mentioned above, the gain and band width of this transistor is primarily a function of the base width, i.e, the vertical distance in FIG. 7 between the region 35 and the layer 22. As can easily be appreciated, this base width is easily controllable by proper control of the thickness of the epitaxial layer 20 and the diffusion depth of the region 35. With this configuration, base widths in the order of 0.5 micron are easily obtainable.

Figure 8:
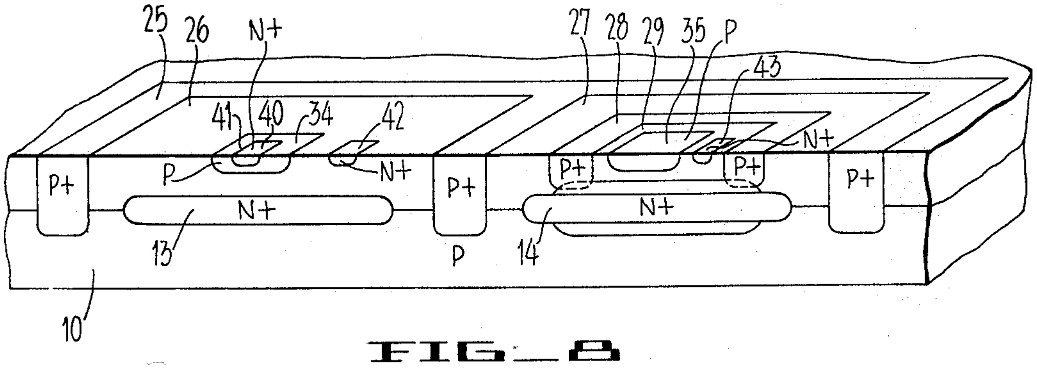
FIG. 8 is a cross-sectional isometric view of a semiconductor device according to the invention illustrating the final step in the fabrication process to achieve a structure containing a pair of complementary transistors.

The final operation required to complete the transistor of the opposite polarity to that completed in the device of FIG. 7 is shown in FIG. 8 wherein a suitable impurity, for example, phosphorus, is selectively diffused into the surface 21 to form a high conductivity type region 40 of a conductivity type (N+) opposite that of the region 34 within the region 34, thereby forming a PN junction 41 therebetween which extends to the surface 21. The region 40 serves as the emitter region of an NPN transistor whose base is the region 34 and whose collector is the region 26.

At the same time that the diffusion operation to form the emitter region 40 is taking place, as is conventional in the art, additional regions 42 and 43 may be formed in the regions 26 and 29, respectively, for contact purposes. The contact regions 42 and 43 are provided to prevent the formation of rectifying contacts and permit the formation of ohmic contacts by the metal used to form the interconnect pattern to the various regions of the device.

Although not shown, it is understood that in order for the device of FIG. 8 to be functional, metal contacts or connections must be made to at least the various regions making up the two transistors, i.e., the regions 40, 34, 26 and 28, 29, and 35. This may be done in any convenient or conventional manner. For example, contacts to the various regions may be formed by depositing a layer of metal over an oxide mask which covers the surface 21 and has openings therein whereat it is desired to make contact to the underlying regions, and then etching away the undesired portions of metal to form a desired pattern of conductors.

Figure 9:
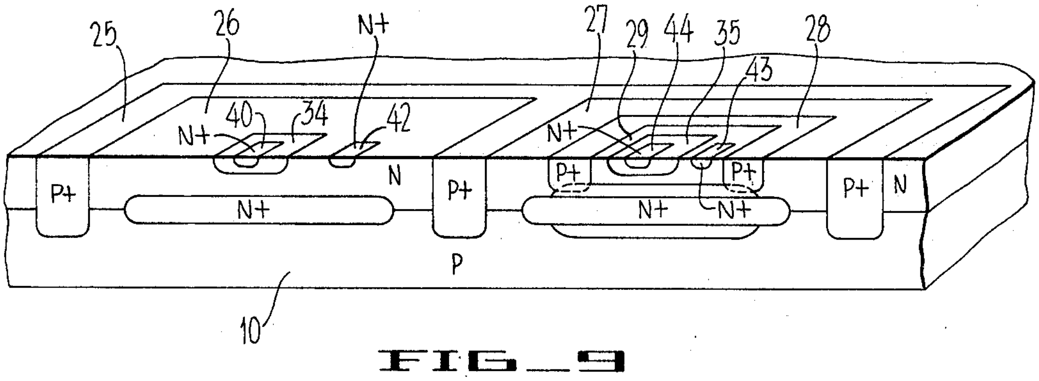
FIG. 9 is a cross-sectional isometric vie of a semiconductor device according to the invention illustrating the final step in the fabrication process to achieve a structure containing a transistor and an SCR.
Figure 10:
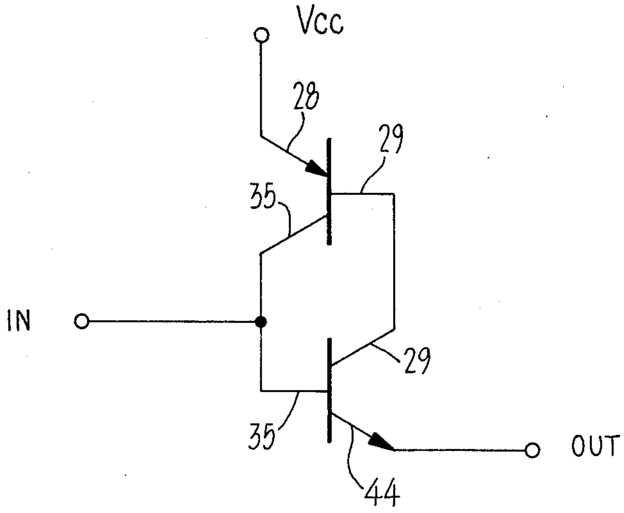
FIG. 10 is a schematic diagram of the equivalent circuit of the SCR portion of the structure of FIG. 9.

If, instead of a pair of complementary transistors, it is desired that one of the structures be a four-layer device, e.g., an SCR, then as indicated above, such a structure can be obtained according to the invention without requiring any additional processing the structure. As shown in FIG. 9, at the same time that the regions 40, 42, and 43 are formed adjacent the surface 21, an additional region 44 is formed within the region 35, thereby forming a PN junction 45 which extends to the surface 21. The structure thus formed within the region 27 is a PNPN device which can function as an SCR when the proper exciting and control voltages are applied. A schematic diagram showing the equivalent circuit of the PNPN device and the proper positions for connections thereto is shown in FIG. 10.

In summary, the invention provides a structure containing a pair of complementary vertical structures which can be fabricated by a process utilizing only a single diffusion step in addition to those steps necessary to form a conventional double diffused transistor in an integrated circuit.

Obviously, various modifications of the invention are possible in light of the above teachings without departing from the spirit and scope of the invention. Accordingly, the invention is to be limited only as recited in the appended claims.

What is claimed is:

1. A semiconductor structure comprising:

a unitary body of semiconductor material having a substrate of a first conductivity type;

a layer of semiconductor material of the opposite conductivity type disposed on said substrate and having an exposed substantially planar surface;

means extending from said surface to said substrate for providing first and second electrically isolated semiconductor regions within said layer;

a third semiconductor region of said first conductivity type disposed within said first region and forming a PN junction that extends to said surface;

a fourth semiconductor region of said opposite conductivity type disposed within said third region and forming a PN junction that extends to said surface whereby said first, third, and fourth regions comprise a first vertical transistor wherein said third region serves as the base region and said first and fourth regions serve as the collector and emitter regions;

a layer of semiconductor material of said first conductivity type buried within said second region remote from said surface and remote from said substrate;

a fifth semiconductor region of said first conductivity type formed within said second region and extending from said surface to said buried layer and joining therewith to form a composite region, said fifth region having a closed geometrical shape so that said composite region encloses a portion of said second region, said enclosed portion of said second region forming a PN junction with said composite region which extends to said surface; and a sixth semiconductor region of said first conductivity type located within said enclosed portion of said second region and forming a PN junction therewith which extends to said surface, so that said enclosed portion of said second region, said composite region and said sixth region form a structure operable as a second vertical transistor having a polarity opposite to that of said first transistor wherein said enclosed portion of said second region serves as the base region, and said composite region and said sixth region serve as the emitter and collector regions, respectively.

2. The semiconductor structure of claim 1 further comprising a highly conductive semiconductive layer of said opposite conductivity type located within said second region and extending from said substrate to said buried layer.

3. The semiconductor structure of claim 2 wherein said means for electrically isolating said first and second regions comprises a semiconductor region of said first conductivity type.

References Cited

UNITED STATES PATENTS

| | | | |
|---|---|---|---|
| 3,260,902 | 7/1966 | Porter | 317—235 |
| 3,327,182 | 6/1967 | Kisinko | 317—235 |
| 3,370,995 | 2/1968 | Lowery et al. | 148—175 |
| 3,379,584 | 4/1968 | Bean et al. | 148—175 |
| 3,309,537 | 3/1967 | Archer | 307—88.5 |

JOHN W. HUCKERT, Primary Examiner

M. H. EDLOW, Assistant Examiner

U.S. Cl. X.R.

148—196